(12) United States Patent
Wilcox

(10) Patent No.: US 6,452,810 B1
(45) Date of Patent: Sep. 17, 2002

(54) SLIDING BARRIER FOR AN ELECTRICAL ENCLOSURE

(75) Inventor: Amy J. Wilcox, Clemson, SC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/735,353

(22) Filed: Dec. 12, 2000

(51) Int. Cl.⁷ .............................. H02B 1/04; H05K 7/14
(52) U.S. Cl. ...................... 361/796; 361/601; 361/616; 361/727; 312/223.1
(58) Field of Search ................................ 361/601, 602, 361/611, 616, 641, 648, 650, 657, 796, 797, 727; 49/501, 130; 312/223.1

(56) References Cited

U.S. PATENT DOCUMENTS

| | | | | |
|---|---|---|---|---|
| 4,574,526 A | * | 3/1986 | Lindquist | 49/411 |
| 5,225,962 A | * | 7/1993 | Neill et al. | 361/643 |
| 5,414,590 A | * | 5/1995 | Tajali | 361/669 |
| 5,654,871 A | * | 8/1997 | Wentler et al. | 361/622 |
| 5,845,579 A | * | 12/1998 | Langley et al. | 104/31 |

\* cited by examiner

*Primary Examiner*—Jayprakash N. Gandhi
(74) *Attorney, Agent, or Firm*—David R. Stacey; Larry T. Shrout; Larry I. Golden

(57) ABSTRACT

A sliding barrier for an electrical enclosure for selectively providing or prohibiting access to electrical conductors behind the barrier. The barrier includes upper and lower tracks and two substantially identically configured slidable panels. The panels are provided with operators for manually sliding the panels between open and closed positions. The panels are also provided with an interference interlock that inhibits unintentional opening of the panels and gapping between the panels when closed.

18 Claims, 5 Drawing Sheets

SLIDING BARRIER FOR AN ELECTRICAL ENCLOSURE

CROSS-REFERENCE TO RELATED PATENTS

Not applicable

STATEMENT REGARDING FEDERALLY SPONSORED RESEARCH OR DEVELOPMENT

Not applicable

FIELD OF THE INVENTION

The present invention relates to the field of electrical enclosures, and particularly to sliding barriers in the electrical bussing area.

Figure 1:
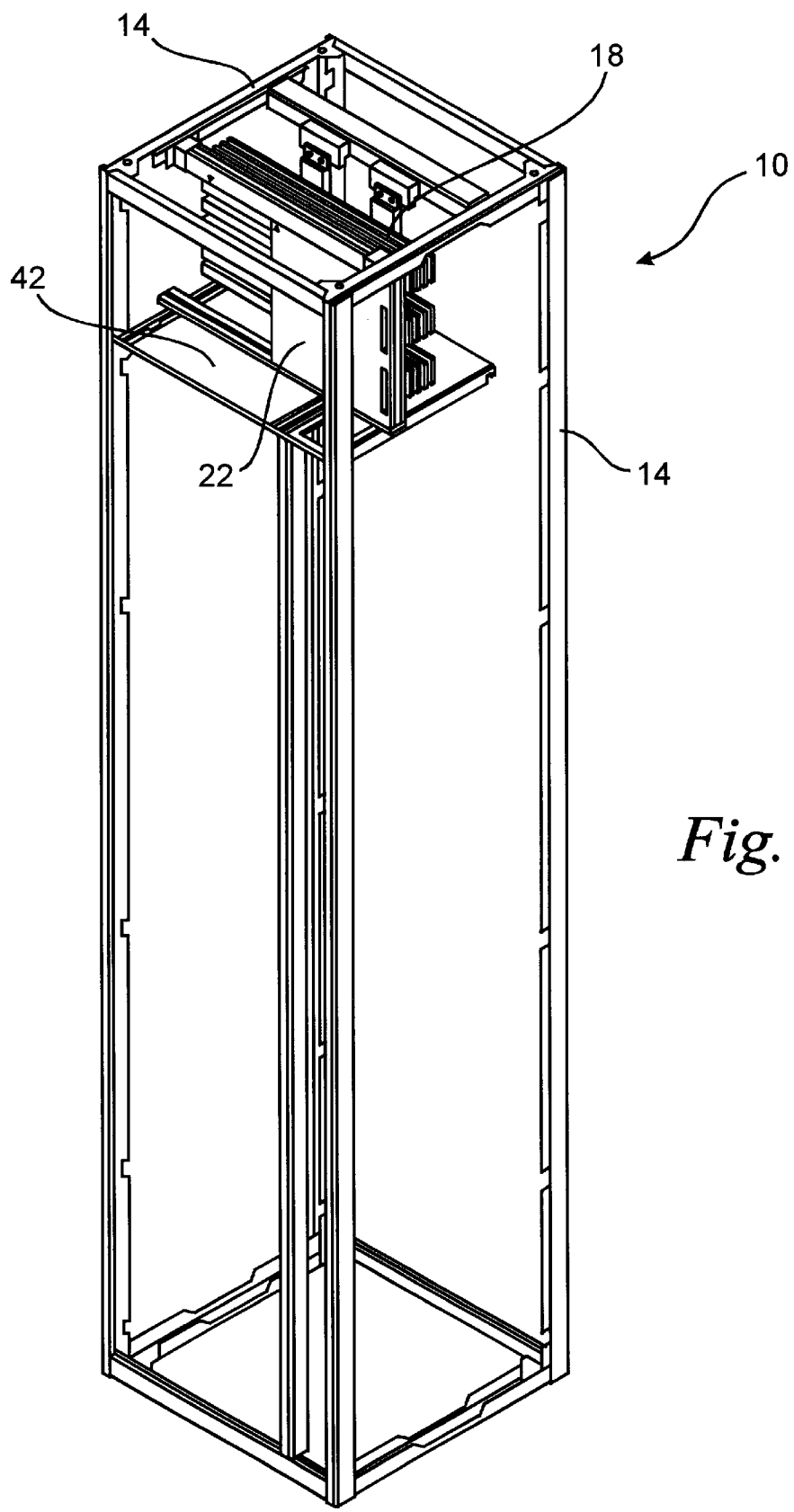
FIG. 1 is an isometric view of an electrical enclosure frame having a slidable barrier constructed in accordance with the present invention.

Before one embodiment of the invention is explained in detail, it is to be understood that the invention is not limited in its application to the details of construction described herein or as illustrated in the drawings. The invention is capable of other embodiments and of being practiced or being carried out in various other ways. Further, it is to be understood that the phraseology and terminology used herein is for the purpose of description and should not be regarded as limiting.

DETAILED DESCRIPTION OF THE DRAWINGS

FIG. 1 illustrates a typical switchgear, motor control center or switchboard assembly, generally indicated by reference numeral 10, having a structural frame 14 providing support for electrical components of the assembly 10 and on which a protective enclosure is attached. Electrical conductors, such as a horizontal bus 18, are commonly used for connecting a power source to the assembly 10, for connecting multiple assemblies 10 together, and for connecting electrical equipment inside the assembly 10 to the power source. The horizontal bus 18 is generally located in the rear half of the assembly 10 and requires access during installation and for normal maintenance. The area immediately forward of the horizontal bus 18 (between the horizontal bus and the front of the enclosure) is generally used as a wiring compartment for various control and other wires associated with the electrical equipment inside the assembly 10. A sliding barrier assembly 22, constructed in accordance with the present invention, provides easy access to the horizontal bus 18 without requiring the complete removal of a protective barrier.

Figure 2A:
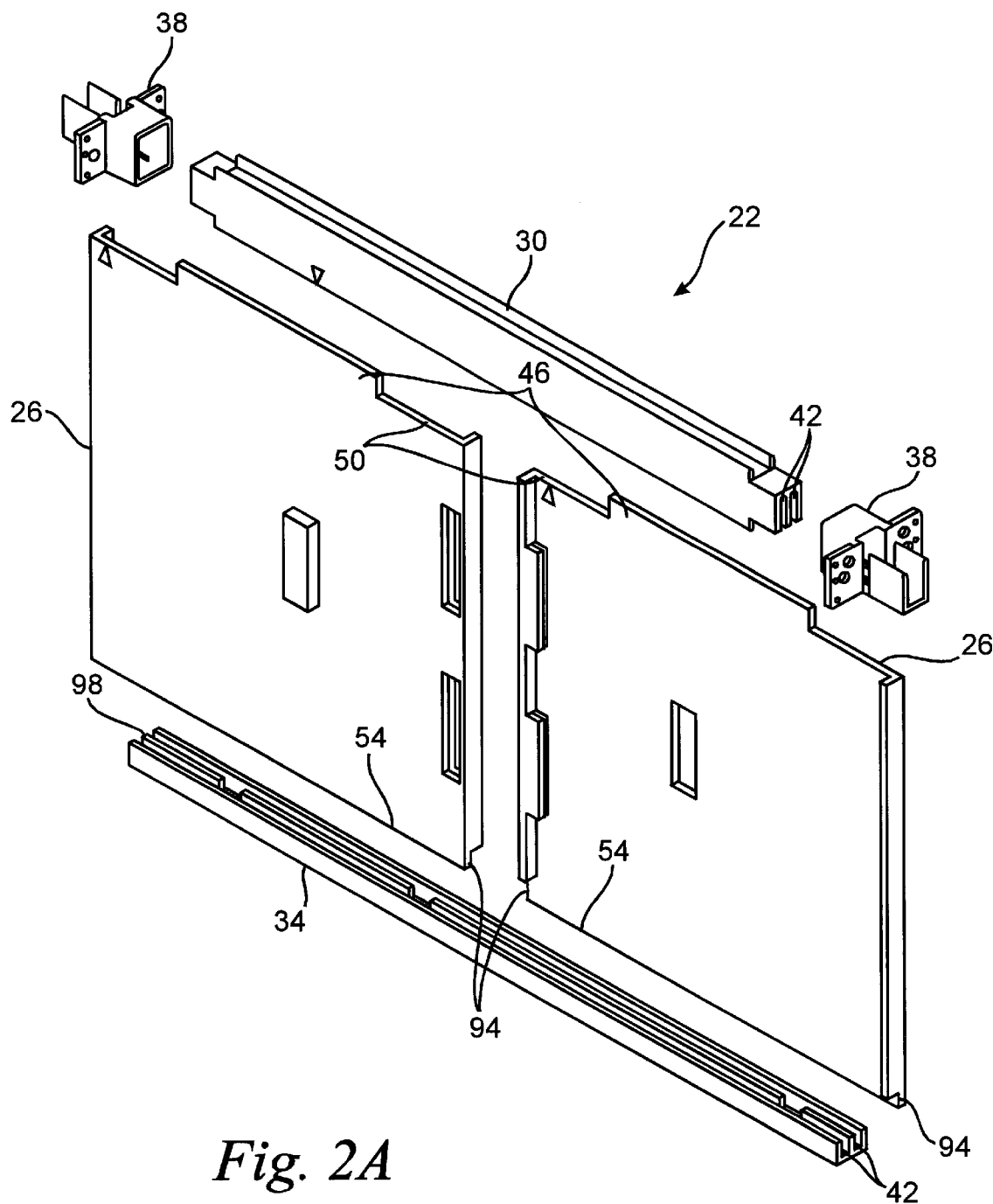
FIG. 2A is an isometric view of a sliding barrier assembly constructed in accordance with the present invention.

Referring now to FIG. 2A, the barrier assembly 22 includes two substantially identically configured panels 26, an upper track 30, a lower track 34 and, in this embodiment, two end caps 38. Although the end caps 38 are intended to allow the upper track to "float" and thereby eliminate critical tolerances, it is to be understood that the end caps 38 can be an integral part of the upper track 30. When assembled in the upper and lower tracks, 30 and 34, respectively, the panels 26 form a slidable barrier in front of the horizontal bus 18. The panels 26 are slidably movable between one of three positions, one providing access the right side of the horizontal bus 18, one providing access to the left side of the horizontal bus 18 (shown in FIG. 1), and one prohibiting access to the horizontal bus 18. The right and left side access positions allow complete access to the horizontal bus 18 from the front of the assembly 10. The upper and lower tracks, 30 and 34, respectively, each have two generally parallel channels 42 extending longitudinally between their ends. Each channel 42 of the upper track 30 receives a tab 46 of one of the two panels 26. The tabs 46 are centrally positioned along a top edge 50 of each panel 26. Each channel 42 of the lower track 34 receives a bottom edge 54 of one of the two panels 26.

Figure 3:
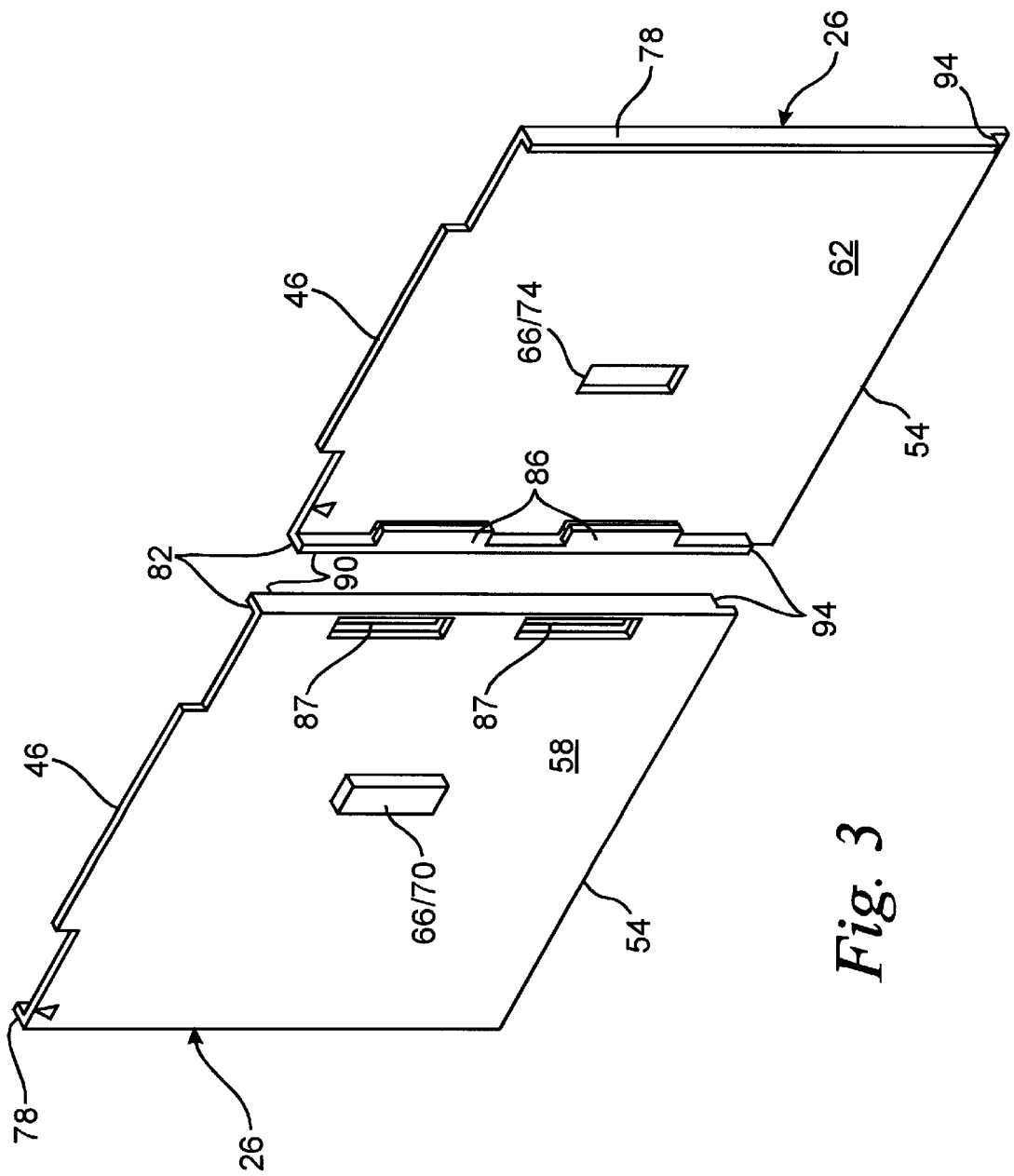
FIG. 3 is an isometric view of two sliding barrier panels constructed in accordance with the present invention.

Referring now to FIG. 3, a more detailed description of the substantially identically configured panels 26 will be provided. Each panel 26 has a generally flat front surface 58 and a generally flat back surface 62. A panel operator 66 is centrally located on the front and back surfaces, 58 and 62, respectively, of each panel 26. On the front surface 58 the operator 66 is configured as a protrusion 70 extending outwardly from the generally flat surface. On the back surface 62, the operator 66 is configured as an indentation 74, extending into the generally flat surface and generally conforming to the shape of the protrusion 70. The operator 66 is dimensioned for easy manual manipulation of the panels 26 between the open and closed positions. One vertical edge of each panel 26 defines a flange 78 extending outwardly from and generally perpendicular to the back surface 62. The other vertical edge defines a flange 82, also extending outwardly from and generally perpendicular to the back surface 62. The flange 82 also defines at least one interlocking tab 86, extending from a distal edge 90 of the flange 82 such that it is generally parallel to the back surface 62. Each interlocking tab 86 include a small rib 87, extending generally across the end of the tab 86 and toward the back surface 62 of the panel 26. The lower end of both flanges, 78 and 82, have a notch 94 dimensioned to clear the center leg 98 of the lower track 34. The flanges 78 provide additional flexural resistance for the panels 26 and a generally flat surface for interfacing with panels 26 of an adjacent assembly 10 or the enclosure of the assembly 10.

Referring again to FIG. 2A, the end caps 38 are slidably received on the ends of the upper track 30 and then attached directly to the support frame 14 of the assembly 10 by commonly available hardware such as screws or rivets, as shown in FIG. 1. The lower track 34 is positioned directly below the upper track 30 such that the channels 42 of the upper and lower tracks, 30 and 34, respectively, are vertically aligned forming front and rear pairs of vertically aligned channels. The lower track 34 is then attached to a shelf 42 or other generally horizontal element of the assembly 10 by commonly available hardware such as screws or rivets. One panel 26 is installed in each of the front and rear pairs of vertically aligned channels such that the back surfaces 62 of the two panels 26 are in opposed relationship. This relationship permits the two panels 26 to slide back and forth in the channels 42 between the closed position and either of the right or left access positions without interference. This relationship also permits an interference engagement of the ribs 87 of the interlocking tabs 86 when the panels 26 are in the fully closed position, thereby inhibiting unintentional opening of the panels 26. Engagement of the interlocking tabs 86 also inhibits lateral gapping between the two panels 26, which could result from intentional or unintentional pressure applied to either of the generally flat front or back surfaces, 58 or 62, respectively, of one or both panels 26.

Figure 2B:
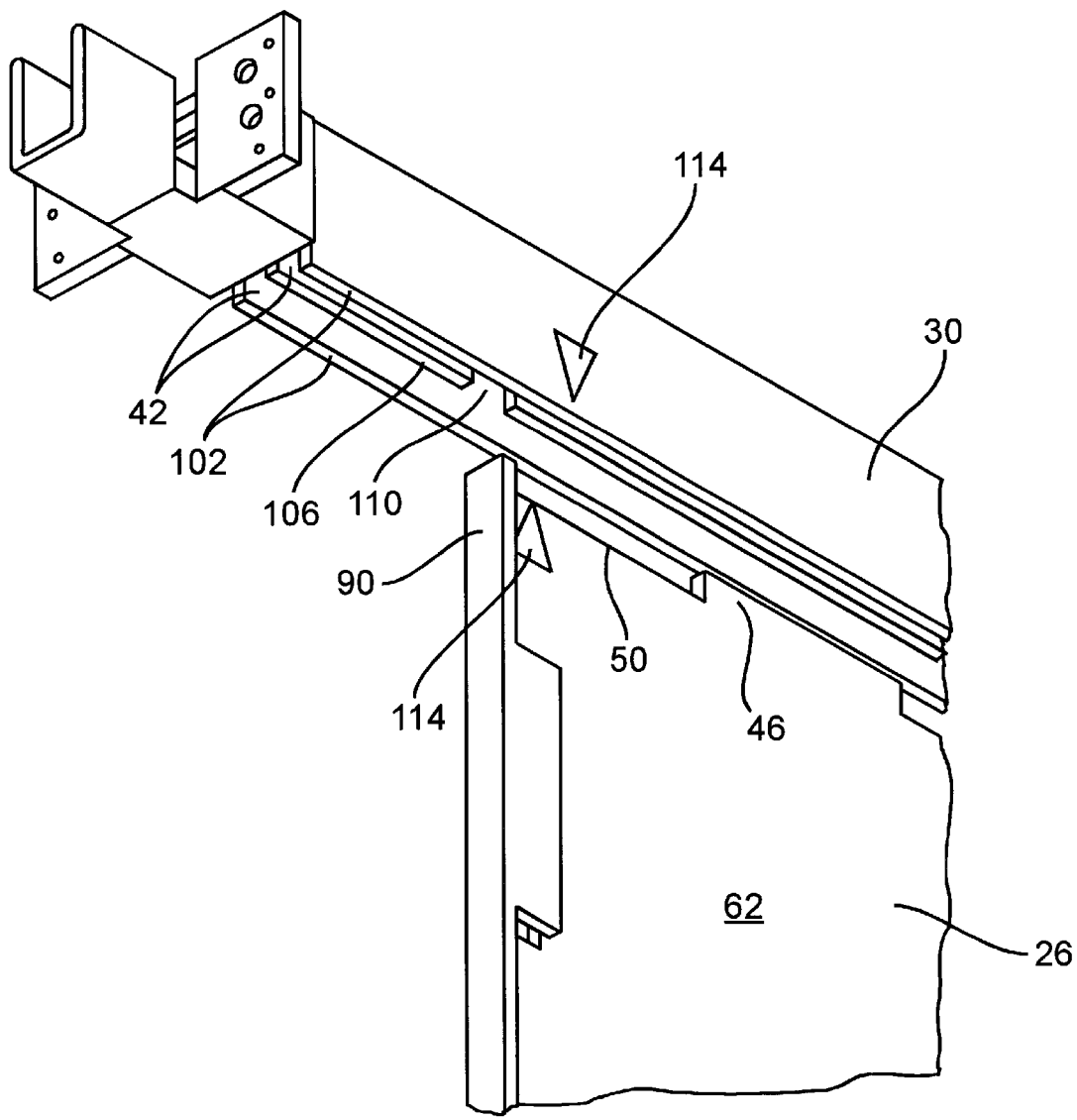
FIG. 2B is an isometric partial view of an upper track and panel constructed in accordance with the present invention.

Referring now to FIG. 2B, the two parallel channels 42 of the upper track 30 are defined by two outside legs 102 and a center leg 106. The two outside legs 102 are longer that the center leg 106 such that when the panels 26 are installed, their top edges 50 will be behind the outside legs 102, minimizing any gaps between the top edges 50 and the upper track 30. The center track also has two notches 110 (only one shown) positioned to receive the flanges 78 and 90 of the panels 26 during installation and removal of the panels 26. The center leg 106 and the tab 46 are dimensioned such that the panels 26 can only be installed or removed when the flanges 78 and 90 are in alignment with the notches 110. This helps to inhibit any unintentional removal of the panels 26 from the barrier assembly 22. The alignment position is indicated by index arrows 114 on the upper track 30 and the panels 26. To install or remove a panel 26 the index arrow 114 of the upper track 30 must be aligned with the index arrow 114 of the panel.

Figure 4:
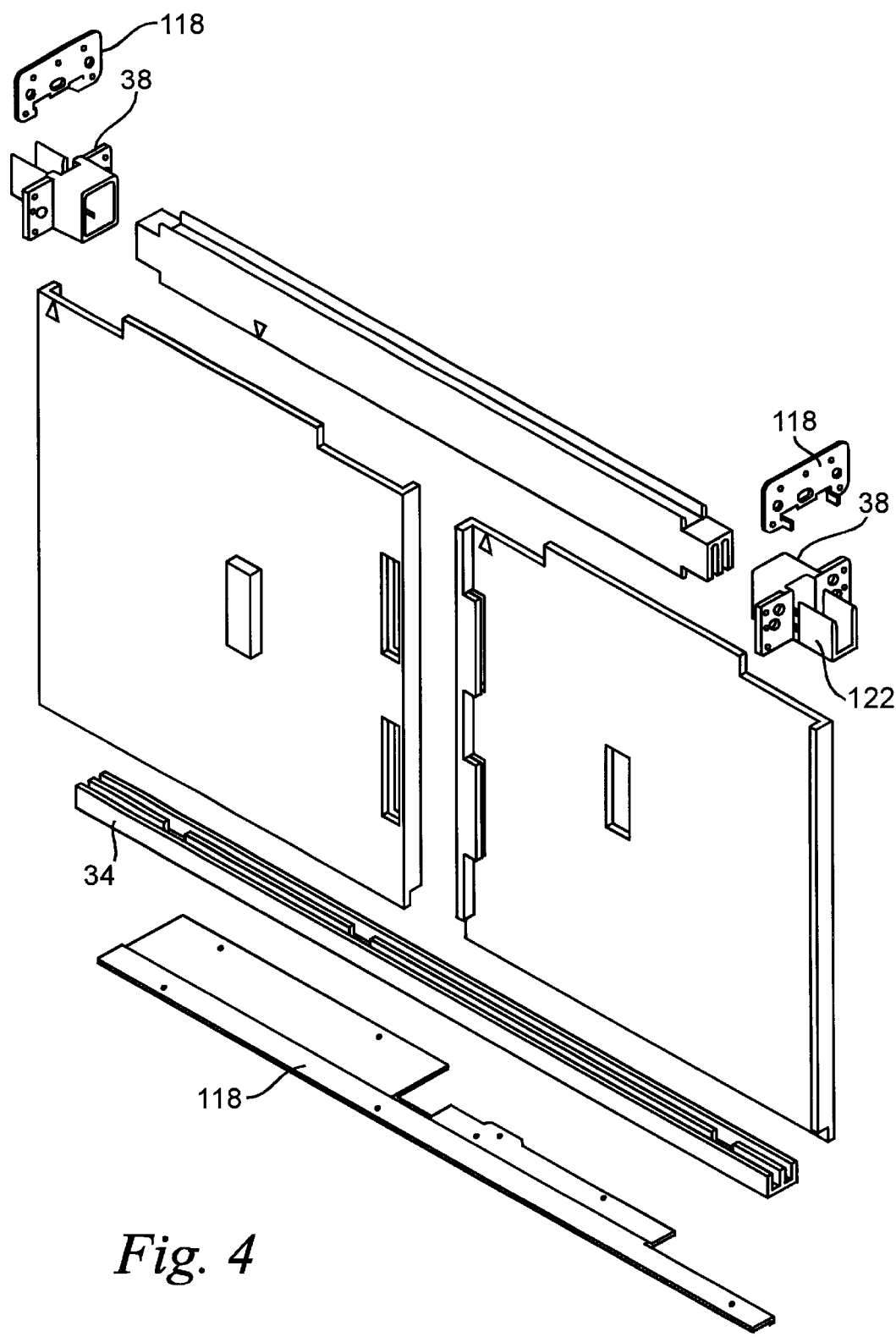
FIG. 4 is an isometric view illustrating brackets that may be required in a retrofit application.

The barrier assembly 22 can also be used to retrofit existing assemblies 10. As shown in FIG. 4, retrofit applications may require additional brackets 118 for installing the end caps 38 and lower track 34. The configuration of these brackets 118 is dependent on the retrofit application. It is also conceivable that the extending end 122 of the end cap 38 can be removed such that the end cap 38 can be installed directly on the enclosure sidewall (not shown).

I claim:

1. An electrical enclosure having a slidable barrier, said enclosure comprising:
   a structural frame for supporting electrical equipment and a protective enclosure;
   an electrical bus providing electric power to the electrical equipment;
   an upper track being attached to said structural frame such as to be adjacent and generally parallel to said electrical bus;
   a lower track positioned below and in vertical alignment with said upper track, said lower track being attached to an element of said protective enclosure;
   two panels being substantially identical in configuration and slidably retained between said upper and lower tracks, said panels being slidably movable between a right access position, a closed position and a left access position.

2. The electrical enclosure of claim 1, wherein in said right access position or said left access position a right half or a left half, respectively, of said electrical bus is exposed.

3. The electrical enclosure of claim 1, wherein in said closed position access to said electrical bus is prohibited.

4. The electrical enclosure of claim 1, wherein each said panel defines an integrally formed interlocking tab, said interlocking tabs of said two panels being engaged when said two panels are in said closed position, engaged said interlocking tabs inhibiting unintentional opening of said panels and lateral gapping between said panels.

5. The electrical enclosure of claim 1, wherein each said panel defines an integrally formed operator for manually moving said panels between said right access position, said closed position and said left access position.

6. The electrical enclosure of claim 1, wherein said upper track and said panels are configured such that said panels can only be installed or removed at a predetermined position with respect to said upper track.

7. The electrical enclosure of claim 6, wherein said predetermined position is indicated by an index arrow marked on said upper channel and an index arrow marked on said panel.

8. The electrical enclosure of claim 1, wherein said upper track is supported at each end by an end cap, each said end cap being attached to said structural frame.

9. A sliding barrier assembly comprising:
   an upper track defining two generally parallel longitudinally extending channels;
   a lower track defining two generally parallel longitudinally extending channels, said upper track being positioned above said lower track such that said two longitudinally extending channels of said upper track are generally in vertical alignment with said two longitudinally extending channels of said lower track thereby forming two vertically aligned pairs of channels;
   two panels being substantially identical in configuration such that each said panel includes an integrally formed operator and at least one integrally formed interlocking tab, one of said panels being slidably retained in each of said generally vertically aligned pairs of channels, and arranged such that said panels are slidably movable between an open position and a closed position by engaging said operator of one or both of said panels and further that said at least one interlocking tab of each of said panels are cooperatively engaged when said panels are in the closed position.

10. The barrier assembly of claim 9, wherein said at least one interlocking tab of said panels, when engaged, inhibits unintentional opening of said panels and lateral gapping between said panels.

11. The barrier assembly of claim 9, wherein said panels each define a central tab extending from a top edge of said panels, said central tab of each said panel being received within one of said two channels of said upper track.

12. The barrier assembly of claim 9, wherein said panels each define a generally flat front surface and a generally flat back surface.

13. The barrier assembly of claim 12, wherein said operator is configured as a protrusion extending outwardly from said front surface and a indentation extending into said back surface, said indentation generally conforming to the shape of said protrusion.

14. The barrier assembly of claim 12, wherein said panels each define a bottom edge intermediate two vertical edges, said vertical edges each defining a flange extending outwardly from and generally perpendicularly to said back surface.

15. The barrier assembly of claim 14, wherein said flanges of each said panel define a notch at their intersection with said bottom edge, said notch dimensioned to clear said center leg of said lower track for proper orientation and installation of said panels.

16. The barrier assembly of claim 14, wherein said interlocking tabs extend from one of said flanges such as to be generally parallel to said back surface of said panel.

17. The barrier assembly of claim 14, wherein said two channels of said upper track are defined by two outer legs and a center leg, said center leg being shorter in height than said two outer legs and defining at least one notch therein.

18. The barrier assembly of claim 17, wherein said at least one notch of said center leg must be aligned with at least one of said flanges of said panels to installed or removed said panels from said barrier assembly.

* * * * *